United States Patent
Kawakita et al.

(10) Patent No.: US 8,963,348 B2
(45) Date of Patent: Feb. 24, 2015

(54) PACKAGED ENGINE WORKING MACHINE

(75) Inventors: Keisuke Kawakita, Osaka (JP); Tatsuya Kawano, Osaka (JP); Masaaki Ono, Osaka (JP)

(73) Assignee: Yanmar Co., Ltd., Osaka-shi (JP)

( * ) Notice: Subject to any disclaimer, the term of this patent is extended or adjusted under 35 U.S.C. 154(b) by 0 days.

(21) Appl. No.: 13/985,465

(22) PCT Filed: Feb. 10, 2012

(86) PCT No.: PCT/JP2012/053111
§ 371 (c)(1),
(2), (4) Date: Aug. 14, 2013

(87) PCT Pub. No.: WO2012/111556
PCT Pub. Date: Aug. 23, 2012

(65) Prior Publication Data
US 2013/0314872 A1 Nov. 28, 2013

(30) Foreign Application Priority Data

Feb. 15, 2011 (JP) ................................. 2011-029796

(51) Int. Cl.
*F02B 63/04* (2006.01)
*H02K 7/18* (2006.01)
*H05K 7/20* (2006.01)
(Continued)

(52) U.S. Cl.
CPC .......... *H05K 7/20145* (2013.01); *F02B 63/044* (2013.01); *F01P 2001/005* (2013.01)
USPC ...................... 290/1 A; 290/2; 123/2; 454/338

(58) Field of Classification Search
USPC ............................. 290/1 A, 2; 123/2; 454/338
See application file for complete search history.

(56) References Cited

U.S. PATENT DOCUMENTS 4,117,342 A * 9/1978 Melley, Jr. ..................... 290/1 A
4,122,353 A * 10/1978 Noguchi ........................ 290/1 A
4,136,432 A * 1/1979 Melley, Jr. ...................... 29/469
(Continued)

FOREIGN PATENT DOCUMENTS

JP 60-187378 U 12/1985
JP 2000-88281 A 3/2000
(Continued)

OTHER PUBLICATIONS

Japanese-language Written Opinion (PCT/ISA/237) dated Apr. 17, 2012 (Three (3) pages).
(Continued)

*Primary Examiner* — Pedro J Cuevas
(74) *Attorney, Agent, or Firm* — Crowell & Moring LLP

(57) ABSTRACT

A packaged engine working machine is provided. The machine includes an electrical component containing space partitioned into two spaces and a cooling air intake port. An engine disposed in the lower space of a package and electrical components disposed in the upper space, the upper space being partitioned into a high heat generation chamber containing high heat components, a low heat generation chamber containing low heat components, and an intake fan chamber provided with an intake fan for drawing outside air through the intake port. A high heat generation chamber cooling path and a low hear generation chamber cooling part are provided in which outside air reaching the intake fan chamber passes through the chambers via first, second and third communication ports.

7 Claims, 12 Drawing Sheets

(51) Int. Cl.
 *B60L 1/02* (2006.01)
 *F01P 1/00* (2006.01)

(56) References Cited

U.S. PATENT DOCUMENTS

| | | | | |
|---|---|---|---|---|
| 4,384,673 | A * | 5/1983 | Carson | 237/12.1 |
| 4,608,946 | A * | 9/1986 | Tanaka et al. | 123/2 |
| 4,647,835 | A * | 3/1987 | Fujikawa et al. | 322/1 |
| 4,736,111 | A * | 4/1988 | Linden | 290/2 |
| 5,483,417 | A * | 1/1996 | Tanimizu | 361/611 |
| 5,624,589 | A * | 4/1997 | Latvis et al. | 219/133 |
| 5,642,702 | A * | 7/1997 | Kouchi et al. | 123/198 E |
| 5,899,174 | A * | 5/1999 | Anderson et al. | 123/2 |
| 5,977,667 | A * | 11/1999 | Hirose | 310/51 |
| 6,376,944 | B1 * | 4/2002 | Grizzle et al. | 310/52 |
| 6,644,247 | B2 * | 11/2003 | Campion | 123/2 |
| 6,784,574 | B2 * | 8/2004 | Turner et al. | 310/58 |
| 7,007,966 | B2 * | 3/2006 | Campion | 280/423.1 |
| 7,049,707 | B2 * | 5/2006 | Wurtele | 290/1 B |
| 7,245,033 | B2 * | 7/2007 | Wurtele | 290/1 A |
| 7,449,793 | B2 * | 11/2008 | Cho et al. | 290/1 A |
| 7,466,034 | B2 * | 12/2008 | Kang et al. | 290/40 C |
| 7,482,705 | B2 * | 1/2009 | Piercey, III | 290/1 A |
| 7,492,050 | B2 * | 2/2009 | Brandenburg et al. | 290/1 B |
| 7,557,458 | B2 * | 7/2009 | Yamamoto et al. | 290/55 |
| 7,795,745 | B2 * | 9/2010 | Mellon et al. | 290/1 A |
| 7,849,680 | B2 * | 12/2010 | Shaff et al. | 60/295 |
| 7,958,717 | B2 * | 6/2011 | Nakano et al. | 60/39.83 |
| 7,978,460 | B2 * | 7/2011 | Dykes | 361/641 |
| 8,186,314 | B2 * | 5/2012 | Brunelli et al. | 123/2 |
| 8,314,526 | B2 * | 11/2012 | Fukuda et al. | 310/89 |
| 8,344,528 | B2 * | 1/2013 | Bassett | 290/1 R |
| 8,450,864 | B2 * | 5/2013 | Kawakita et al. | 290/1 A |
| 8,544,425 | B2 * | 10/2013 | Dorn et al. | 123/3 |
| 8,633,606 | B2 * | 1/2014 | Anzioso et al. | 290/2 |
| 8,643,984 | B2 * | 2/2014 | Kawakita et al. | 361/37 |
| 8,672,089 | B2 * | 3/2014 | Kelly et al. | 181/202 |
| 8,680,728 | B2 * | 3/2014 | Errera et al. | 310/86 |
| 2004/0104578 | A1 * | 6/2004 | Wurtele | 290/1 A |
| 2004/0169374 | A1 * | 9/2004 | Wurtele et al. | 290/1 A |
| 2006/0054113 | A1 * | 3/2006 | Yasuda et al. | 123/41.65 |
| 2006/0131885 | A1 * | 6/2006 | Wurtele | 290/1 A |
| 2007/0132243 | A1 * | 6/2007 | Wurtele et al. | 290/1 A |
| 2011/0000407 | A1 * | 1/2011 | Bassett | 110/238 |
| 2011/0057454 | A1 | 3/2011 | Kawakita et al. | 290/1 A |
| 2011/0173962 | A1 * | 7/2011 | Miwa et al. | 60/311 |
| 2012/0146465 | A1 * | 6/2012 | Kawakita et al. | 310/68 D |
| 2013/0076033 | A1 * | 3/2013 | Zachary et al. | 290/2 |
| 2013/0316637 | A1 * | 11/2013 | Kawano et al. | 454/338 |
| 2014/0183863 | A1 * | 7/2014 | Thillen | 290/2 |

FOREIGN PATENT DOCUMENTS

| | | |
|---|---|---|
| JP | 2002-242759 A | 8/2002 |
| JP | 2005-155542 A | 6/2005 |
| JP | 2005-264870 A | 9/2005 |
| JP | 2009-270486 A | 11/2009 |
| JP | 2009-275636 A | 11/2009 |

OTHER PUBLICATIONS

International Search Report dated Apr. 17, 2012 with English translation (Five (5) pages).
International Preliminary Report on Patentability (PCT/IB/338 & PCT/IB/373) dated Aug. 29, 2013, including English translation of Document C1 (Japanese-language Written Opinion (PCT/ISA/237)) previously filed on Aug. 14, 2013 (six (6) pages).

* cited by examiner

PACKAGED ENGINE WORKING MACHINE

TECHNICAL FIELD

The present invention relates to a packaged engine working machine in which an engine, a working machine driven by the engine, and electrical components for the engine and the working machine are stored inside a package.

BACKGROUND ART

A packaged engine working machine is known as a cogeneration apparatus in which a generator and/or a refrigerant compressor serving as working machine(s) are/is driven by an engine to perform electric power generation and/or heat pump air conditioning and to produce warm water by utilizing exhaust heat generated in electric power generation and/or heat pump air conditioning. Such a packaged engine working machine is adapted so that an engine, a working machine driven by the engine, and electrical components for the engine and the working machine are stored inside a package.

For example, Patent Document 1 discloses an electrical component box for an outdoor unit adapted so that an inner space of the electrical component box for storing electrical components are partitioned into two spaces.

PRIOR ART REFERENCE

Patent Document

Patent Document 1: Japanese Patent Application Laid-open No. 2000-88281

SUMMARY

Technical Problem

The electrical component box disclosed in Patent Document 1 is adapted so as to be partitioned by a composite molded substrate into: an upper space in which low current circuit components such as a microcomputer and a peripheral circuit component, etc., are disposed; and a lower space in which high current circuit components such as a power relay and a choke coil, etc., are disposed. Right walls of upper and lower lids of the electrical component box are provided with an outside air inlet for the upper space and an outside air inlet for the lower space, respectively, and a lower left wall of the lower lid is provided with an outside air outlet.

In the electrical component box disclosed in Patent Document 1, the single outside air outlet is used for both of the lower space and the upper space, while the two outside air inlets are separately used for the lower space and the upper space. Therefore, in the electrical component box disclosed in Patent Document 1, a filter has to be disposed for each of the two outside air inlets, which disadvantageously increases the number of assembly steps and the number of maintenance steps for the filters, and thus contributes to cost increase.

Accordingly, the present invention solves the above-mentioned technical problems by providing a packaged engine working machine adapted so that an electrical component storage space for storing electrical components is partitioned into two spaces but a cooling air intake port is provided at a single position in a concentrated manner.

Solution to the Problems

To solve the above-mentioned technical problems, the present invention provides the following packaged engine working machine.

Specifically, a packaged engine working machine according to Claim 1 of the present invention is a packaged engine working machine in which an engine and a working machine driven by the engine are disposed in a lower space of a package, and electrical components for the engine and the working machine are disposed in an upper space of the package, wherein the upper space is partitioned into: a high heat generation chamber in which high heat generation components included in the electrical components are collectively disposed; a low heat generation chamber in which low heat generation components included in the electrical components and having amounts of heat smaller than those of the high heat generation components are collectively disposed; and an intake fan chamber provided with an intake fan for sucking outside air through a single intake port provided in a panel constituting a wall surface of the high heat generation chamber, wherein the high heat generation chamber and the low heat generation chamber are extended in a longitudinal direction of the upper space and adjacent to each other in a width direction of the upper space, and the intake fan chamber is adjacent to the high heat generation chamber and the low heat generation chamber, wherein a first wall serving as a partition between the high heat generation chamber and the intake fan chamber includes a first communication port through which the high heat generation chamber and the intake fan chamber are communicated with each other, wherein a second wall serving as a partition between the high heat generation chamber and the low heat generation chamber includes a second communication port through which the high heat generation chamber and the low heat generation chamber are communicated with each other, wherein a third wall serving as a partition between the low heat generation chamber and the intake fan chamber includes a third communication port through which the low heat generation chamber and the intake fan chamber are communicated with each other, and wherein the packaged engine working machine includes: a high heat generation chamber cooling path through which the outside air from the intake port reaches the intake fan chamber via the high heat generation chamber and the first communication port; and a low heat generation chamber cooling path through which the outside air from the intake port reaches the intake fan chamber via the high heat generation chamber, the second communication port, the low heat generation chamber and the third communication port.

In the packaged engine working machine according to Claim 2 of the present invention, the high heat generation chamber cooling path is shorter than the low heat generation chamber cooling path.

In the packaged engine working machine according to Claim 3 of the present invention, the low heat generation chamber is disposed in a front of the packaged engine working machine.

In the packaged engine working machine according to Claim 4 of the present invention, the intake port is provided at a position distant from the intake fan chamber.

In the packaged engine working machine according to Claim 5 of the present invention, the first communication port is provided close to the first wall.

In the packaged engine working machine according to Claim 6 of the present invention, the second communication port is provided at a position distant from the intake fan chamber.

In the packaged engine working machine according to Claim 7 of the present invention, the third communication port is provided at a position distant from the second communication port.

Advantageous Effects of the Invention

In the invention according to Claim 1, the outside air sucked through the single intake port is diverted as an airflow flowing through the high heat generation chamber cooling path and an airflow flowing through the low heat generation chamber cooling path, and then the diverted airflows are merged in the intake fan chamber. Since it is only necessary to dispose a single filter for the single intake port, the number of assembly steps and the number of maintenance steps for the filter can be reduced, thus achieving the effect of enabling cost reduction.

When the same quantity of air flows to the high heat generation chamber cooling path and the low heat generation chamber cooling path, pressure loss that occurs during flowing of the outside air through the cooling path is reduced in the shorter cooling path, thus increasing the resulting cooling effect. Accordingly, in the invention according to Claim 2, the high heat generation chamber cooling path is shorter in length than the low heat generation chamber cooling path that extends via, for example, the second communication port, thus achieving the effect of more effectively cooling the high heat generation components disposed in the high heat generation chamber.

A working surface is disposed in the front in a usual layout, but when the high heat generation chamber is disposed in the front, an operator might mistakenly come into contact with the high heat generation chamber. The invention according to Claim 3 achieves the effect of preventing the operator from mistakenly coming into contact with the high heat generation chamber.

In the invention according to Claim 4, the intake port is located at a position distant from the intake fan chamber, thus achieving the effect of ensuring the longest possible cooling path in each of the high heat generation chamber and the low heat generation chamber, and the effect of cooling the high heat generation components and the low heat generation components disposed in the high heat generation chamber and the low heat generation chamber, respectively, as uniformly as possible.

In the invention according to Claim 5, the outside air flowing through the high heat generation chamber will flow along the first wall, thus achieving the effect of cooling the high heat generation components, disposed in the high heat generation chamber, as uniformly as possible.

In the invention according to Claim 6, the inlet through which the outside air is introduced into the low heat generation chamber is far away from the intake fan chamber, thus achieving the effect of cooling the low heat generation components, disposed in the low heat generation chamber, as uniformly as possible.

In the invention according to Claim 7, the inlet through which the outside air is introduced into the low heat generation chamber and the outlet through which the outside air is discharged from the low heat generation chamber are farther away from each other, thus achieving the effect of cooling the low heat generation components, disposed in the low heat generation chamber, as uniformly as possible.

DESCRIPTION OF EMBODIMENTS

Hereinafter, a cogeneration apparatus 1 serving as a packaged engine working machine according to one embodiment of the present invention will be described in detail with reference to FIGS. 1 to 12. Note that the cogeneration apparatus 1 is a system in which an electric power transmission line to an electric power consumption device (load) is connected with a commercial power line for an external commercial power source and an electric power generation power line for a generator so as to cover the demand for electric power for the load and so as to recover exhaust heat incident to electric power generation to utilize the recovered heat.

Figure 1:
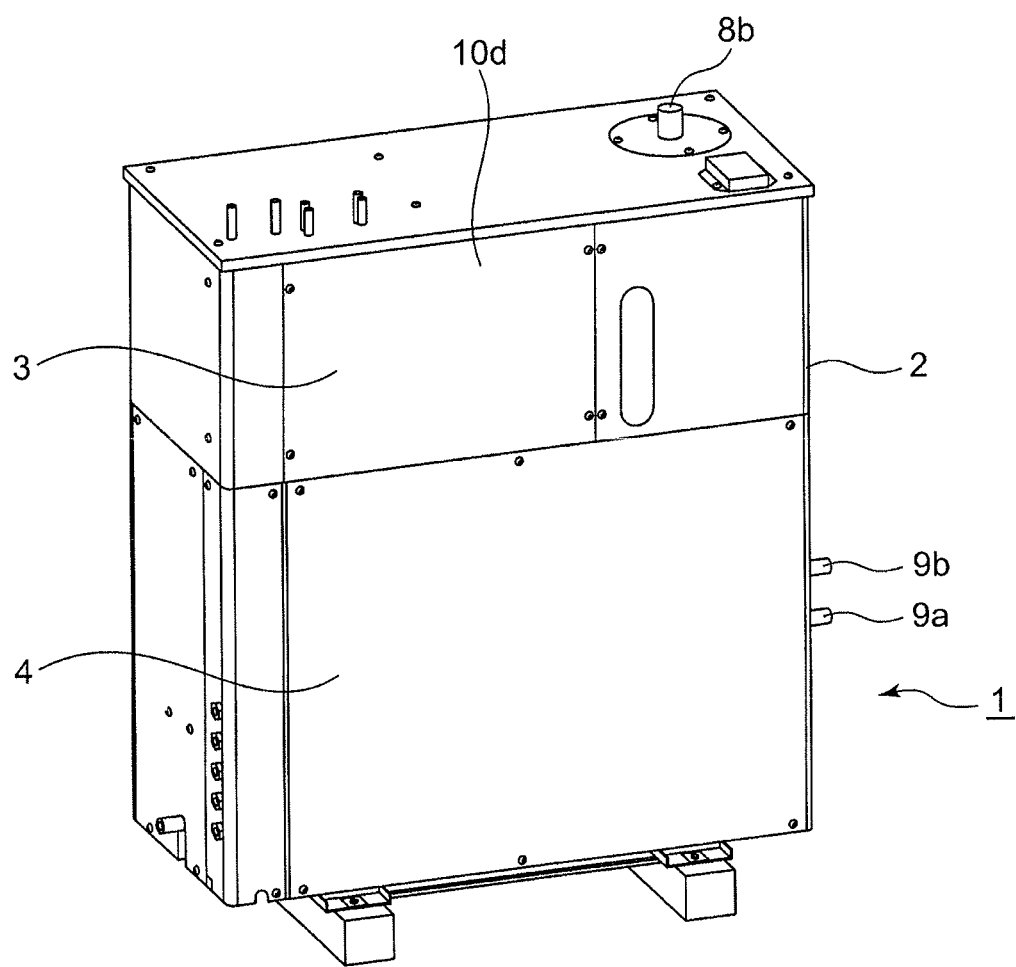
FIG. 1 is an overall front perspective view illustrating a cogeneration apparatus according to one embodiment of the present invention.
Figure 2:
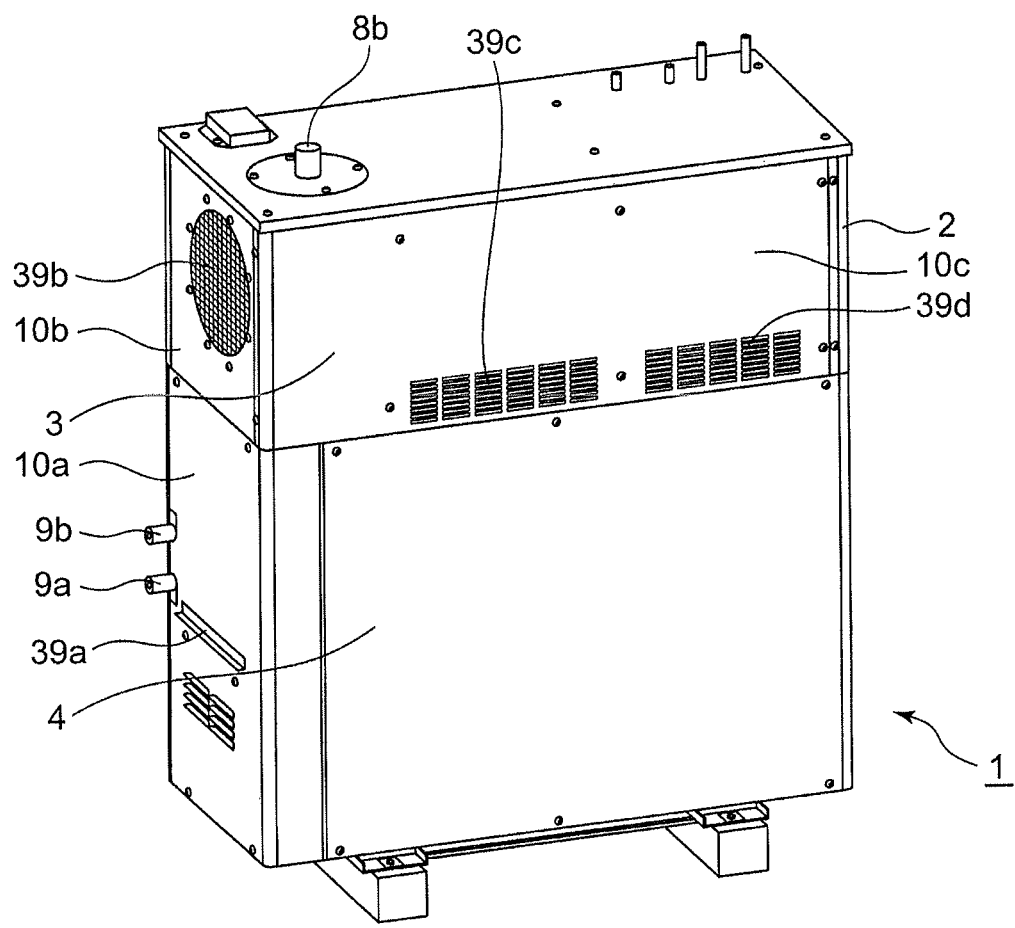
FIG. 2 is an overall rear perspective view illustrating the cogeneration apparatus.

As illustrated in FIGS. 1 and 2, the cogeneration apparatus 1 includes a substantially rectangular parallelepiped package (housing) 2. As illustrated in FIG. 2, an outer surface of the package 2 is covered with a plurality of panels. A right side lower panel 10a is provided with a ventilation intake port 39a, a right side upper panel 10b is provided with a ventilation exhaust port 39b, and a rear upper panel 10c is provided with an engine intake port 39c and an electrical component cooling intake port 39d. These air vents 39a, 39b, 39c and 39d each include a louver, perforated metal or a mesh.

Figure 4:
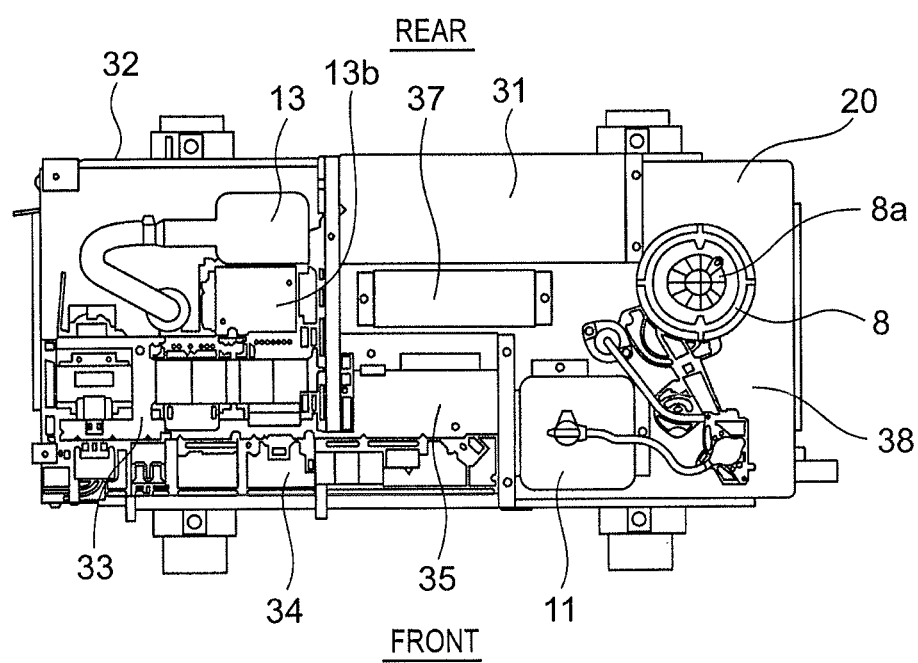
FIG. 4 is a plan view illustrating the inner structure of the cogeneration apparatus.
Figure 5:
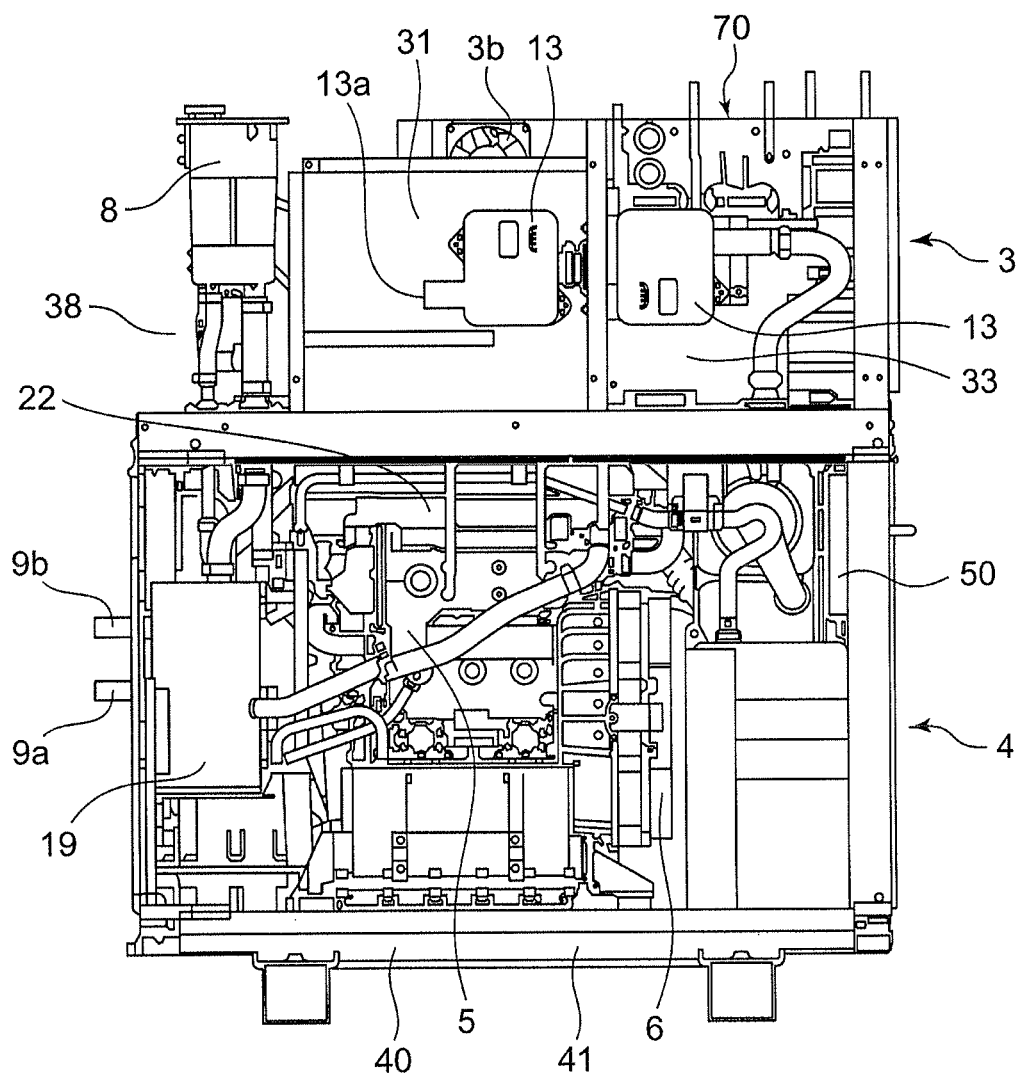
FIG. 5 is a rear view illustrating the inner structure of the cogeneration apparatus.

As illustrated in FIG. 3 and FIGS. 5 to 7, an inside of the package 2 is divided into two spaces, i.e., an upper space 3 and a lower space 4, by a middle wall 20 (illustrated in FIG. 4) located somewhere along a vertical direction of the package 2. As illustrated in FIGS. 4 to 7, the upper space 3 is partitioned by dividing walls into an intake chamber 31, a high heat generation chamber 33, a low heat generation chamber 34, an intake fan chamber 35 and a device storage chamber 38. As illustrated in FIG. 5, an intake silencer 13 having an intake port 13a is disposed in the intake chamber 31. Another intake silencer 13 communicated with the intake silencer 13 in the intake chamber 31 is disposed in the high heat generation chamber 33; in addition, high heat generation components included in electrical components for an engine 5 and a generator 6 are collectively disposed in the high heat generation chamber 33. As illustrated in FIGS. 3 to 6, low heat generation components included in the electrical components for the engine 5 and the generator 6 are collectively disposed in the low heat generation chamber 34, and a mist separator 8 and a cooling water tank 11 are disposed in the device storage chamber 38.

Figure 3:
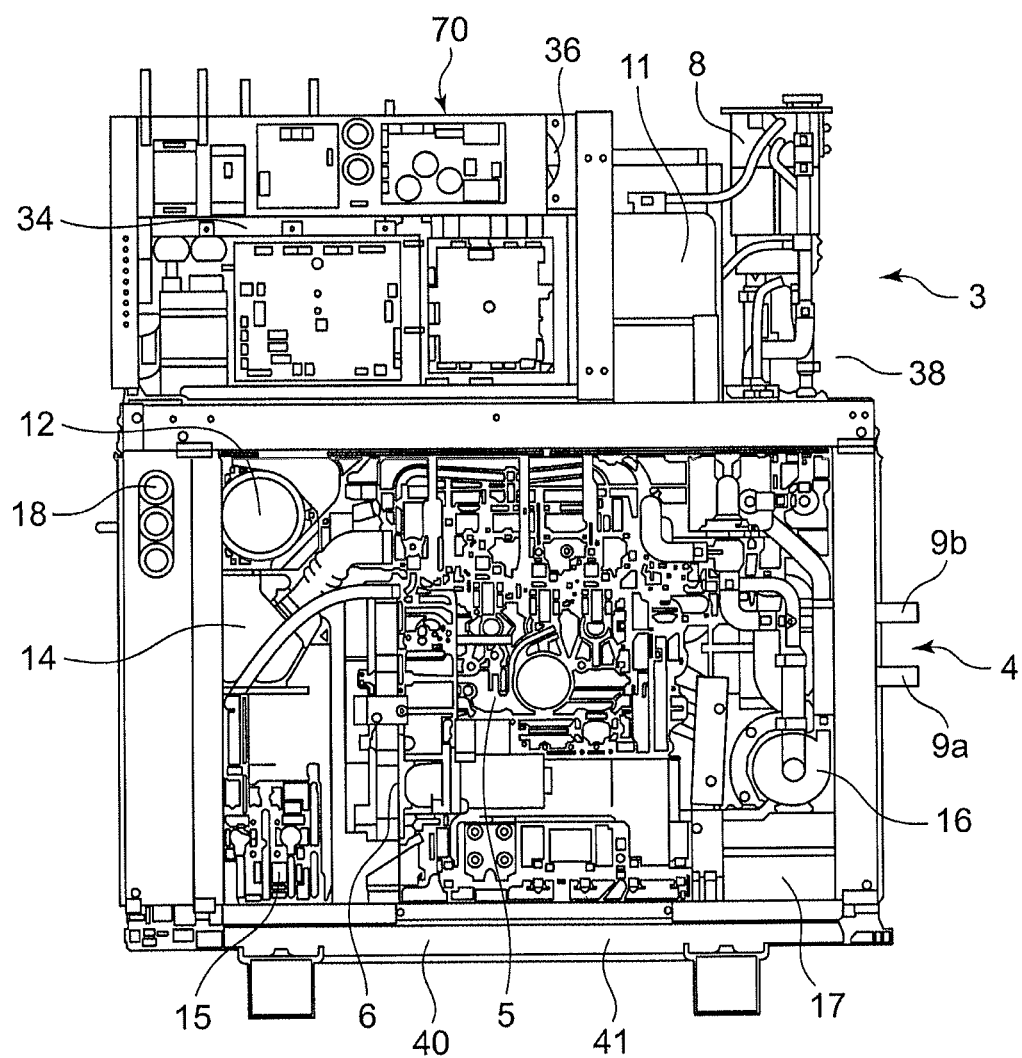
FIG. 3 is a front view illustrating an inner structure of the cogeneration apparatus.
Figure 6:
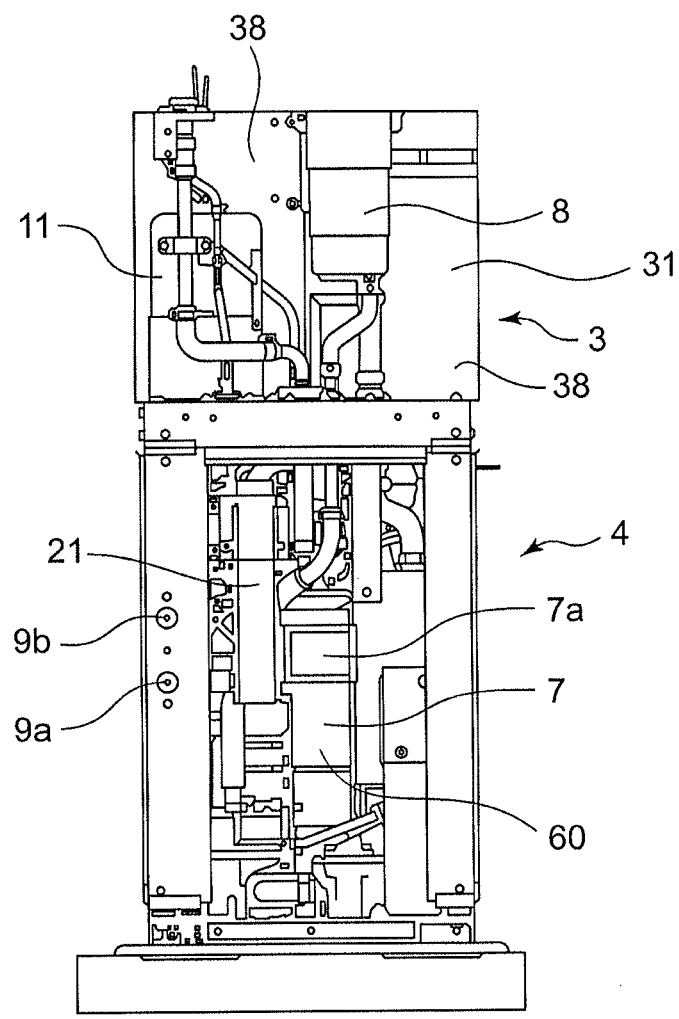
FIG. 6 is a right side view illustrating the inner structure of the cogeneration apparatus.
Figure 7:
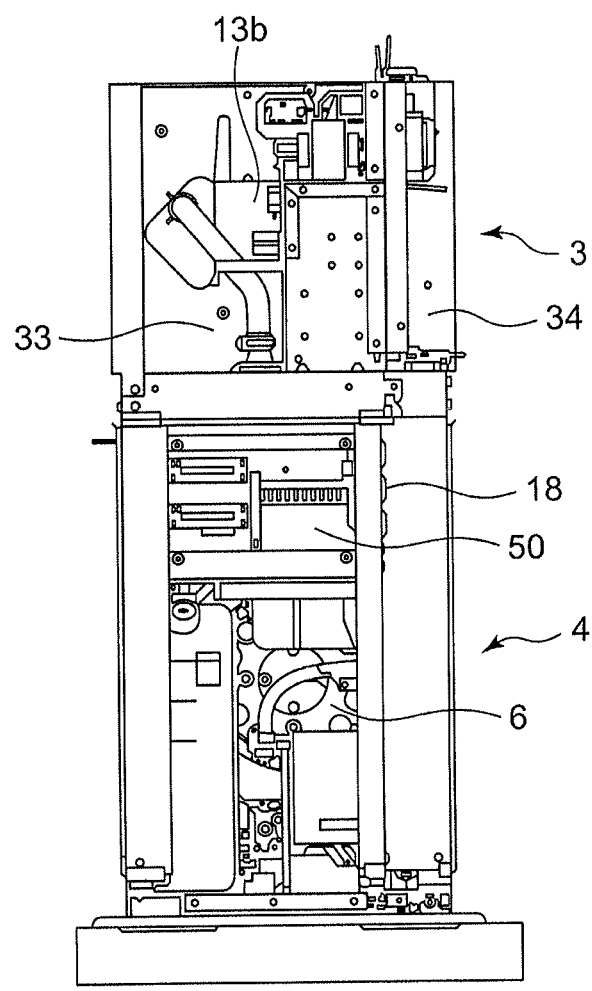
FIG. 7 is a left side view illustrating the inner structure of the cogeneration apparatus.

As illustrated in FIG. 3, the engine 5, the generator 6, an air cleaner 12, an intake silencer 14, a starting transformer (starter) 15, a cooling water pump 16 and a drain filter 17 are disposed in the lower space 4. As illustrated in FIG. 5, an exhaust silencer 19 and an exhaust gas heat exchanger 22 are disposed in the lower space 4. As illustrated in FIG. 6, a ventilation duct 60 and a water-water heat exchanger 21 are disposed in the lower space 4. As illustrated in FIG. 7, a storage box 50 is disposed in the lower space 4. Note that a gas engine, for example, is used as the engine 5. A crankshaft of the engine 5 is driven and rotated, which rotates a generator shaft of the generator 6 serving as a working machine, and thus generates electric power.

The above-mentioned water-water heat exchanger 21 and exhaust gas heat exchanger 22 serve to produce warm water by utilizing heat generated from the engine 5. As illustrated in FIGS. 3, 5 and 6, a water supply port 9a through which cold water is supplied to the heat exchangers 21 and 22, and a warm water outlet 9b through which warm water produced by the heat exchangers 21 and 22 is taken out are disposed vertically side by side at a right lateral surface of the lower space 4.

The storage box 50 illustrated in FIG. 7 stores, as a non-heat-generating electrical component, at least one of a terminal block 53, a relay, a fuse and a breaker. As illustrated in FIG. 3, three external wiring holes 18 through which external input wires and external output wires are connected to, for example, the terminal block 53 of the storage box 50 are disposed vertically side by side at an upper left end portion of the lower space 4.

As illustrated in FIG. 4, an air vent 37 through which the upper space 3 and the lower space 4 are communicated with each other vertically is provided in a substantially center region of the middle wall 20. Outside air taken into the lower space 4 from the ventilation intake port 39a through the ventilation duct 60 flows upward while cooling the engine 5, etc., flows into the device storage chamber 38 of the upper space 3 through the air vent 37, and is then discharged to an outside space from the ventilation exhaust port 39b.

Next, referring to FIGS. 8 to 12, how the high heat generation chamber 33 and the low heat generation chamber 34 are provided in the upper space 3 will be described in detail. Note that a second wall 78 is not illustrated in FIGS. 11 and 12.

Figure 8:
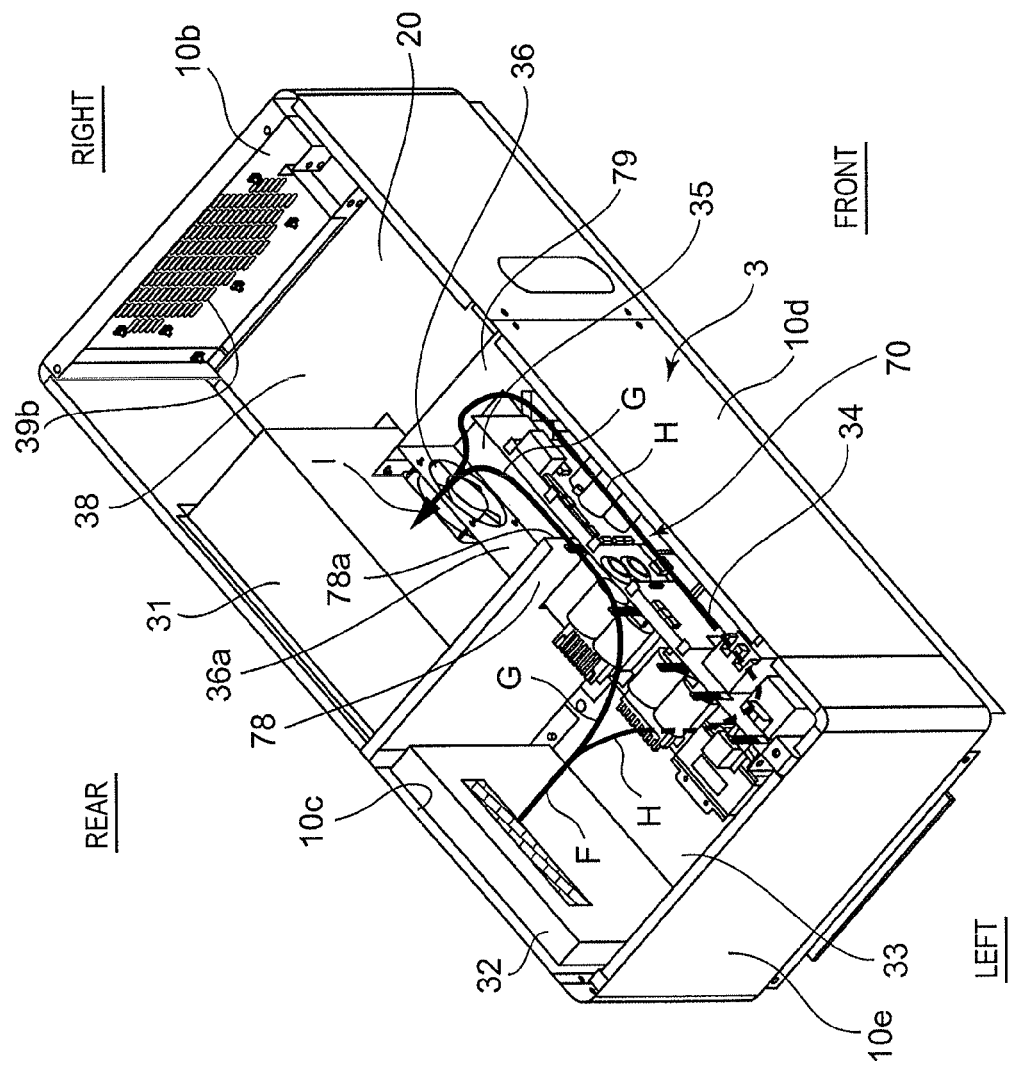
FIG. 8 is a front perspective view schematically illustrating an upper space of the cogeneration apparatus.

As illustrated in FIG. 8, an inside of the upper space 3 is partitioned by a plurality of wall bodies into: the high heat generation chamber 33 disposed in a left region of the upper space 3 and close to its rear in plan view; the low heat generation chamber 34 disposed in a front of the upper space 3 from its left region to its center region; the intake chamber 31 disposed rearward of the center region; the air vent 37 (illustrated in FIG. 10) disposed in the center region and forward of the intake chamber 31; the intake fan chamber 35 disposed in the center region and forward of the air vent 37; and the device storage chamber 38 disposed in a right region of the upper space 3.

The high heat generation chamber 33 is defined by the rear upper panel 10c, a left side upper panel 10e, a first wall 70, and the second wall 78. The low heat generation chamber 34 is defined by a front upper panel 10d, the left side upper panel 10e, the first wall 70, and a third wall 79.

The high heat generation chamber 33 and the low heat generation chamber 34 are extended in a right-left direction of the upper space 3, and are adjacent to each other in a front-rear direction thereof. A length of the low heat generation chamber 34 in the right-left direction is longer than that of the high heat generation chamber 33 in the right-left direction, and the intake fan chamber 35 is disposed adjacent to a rear of the low heat generation chamber 34 on the right of the high heat generation chamber 33. Note that in this example, the right-left direction is defined as a longitudinal direction, and the front-rear direction is defined as a width direction.

In this example, when the high heat generation chamber 33 is disposed rearward of the low heat generation chamber 34 and a front surface serving as a working surface is opened, an operator is prevented from mistakenly coming into contact with the high heat generation chamber 33.

Figure 10:
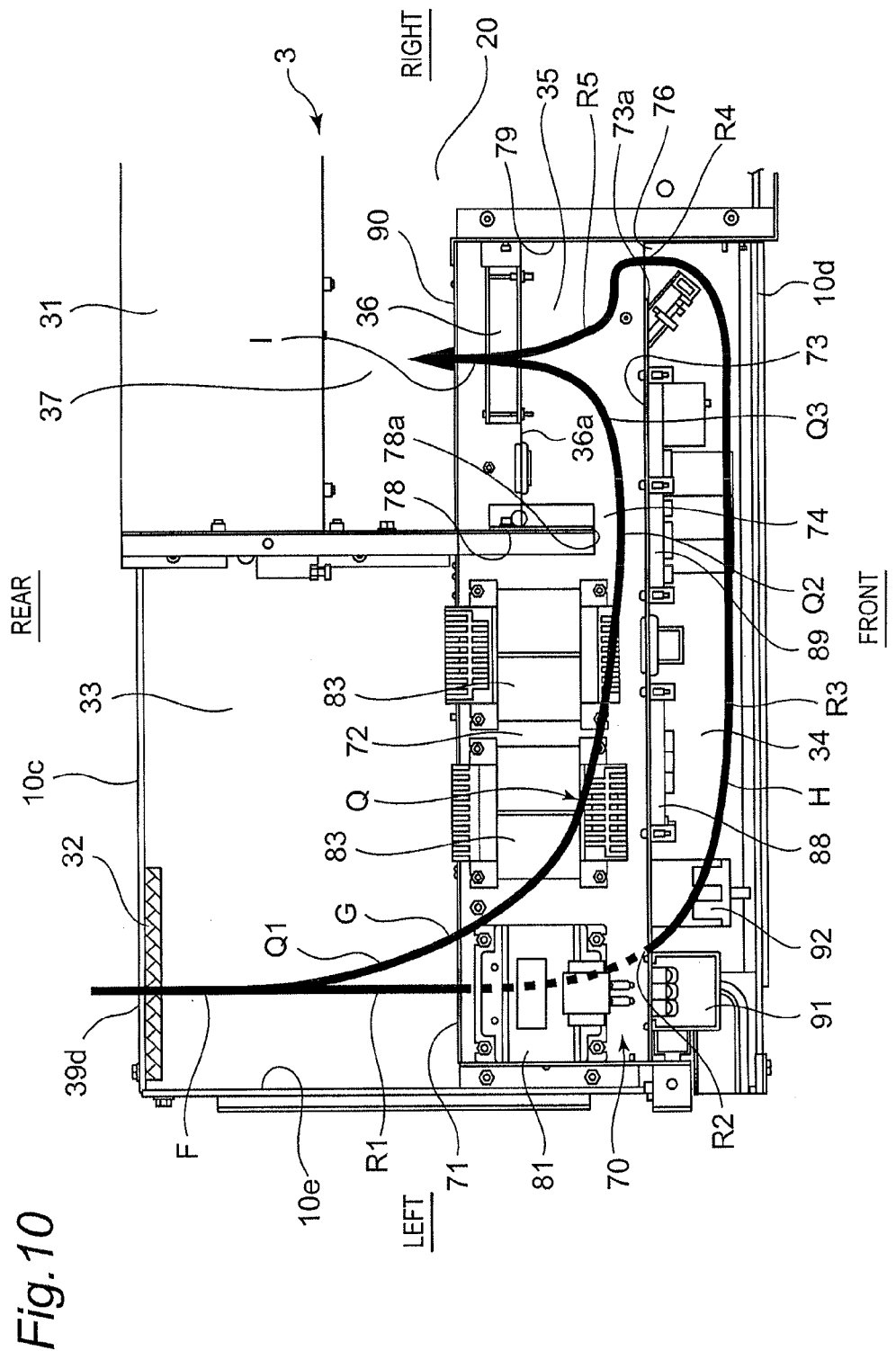
FIG. 10 is a top view schematically illustrating the upper space of the cogeneration apparatus.

As illustrated in FIG. 10, the electrical component cooling intake port 39d is provided in a left portion of the rear upper panel 10c, and a dust-proof filter 32 is disposed inward of the rear upper panel 10c. Accordingly, outside air F is introduced into the high heat generation chamber 33 through the electrical component cooling intake port 39d and the dust-proof filter 32. The electrical component cooling intake port 39d is disposed as far away from the intake fan chamber 35 as possible, thus making it possible to ensure the longest possible cooling path; hence, as illustrated in FIG. 10, the electrical component cooling intake port 39d is preferably disposed close to a left end of the upper space 3 in plan view. For the sake of clarity of the high heat generation chamber 33, the intake silencer 13, and a utility box 13b used to support or fix the intake silencer 13 and to store an additional device are not illustrated in FIGS. 8 and 10. The intake silencer 13 is illustrated in FIGS. 4 and 5, and the utility box 13b is illustrated in FIGS. 4 and 7.

Figure 11:
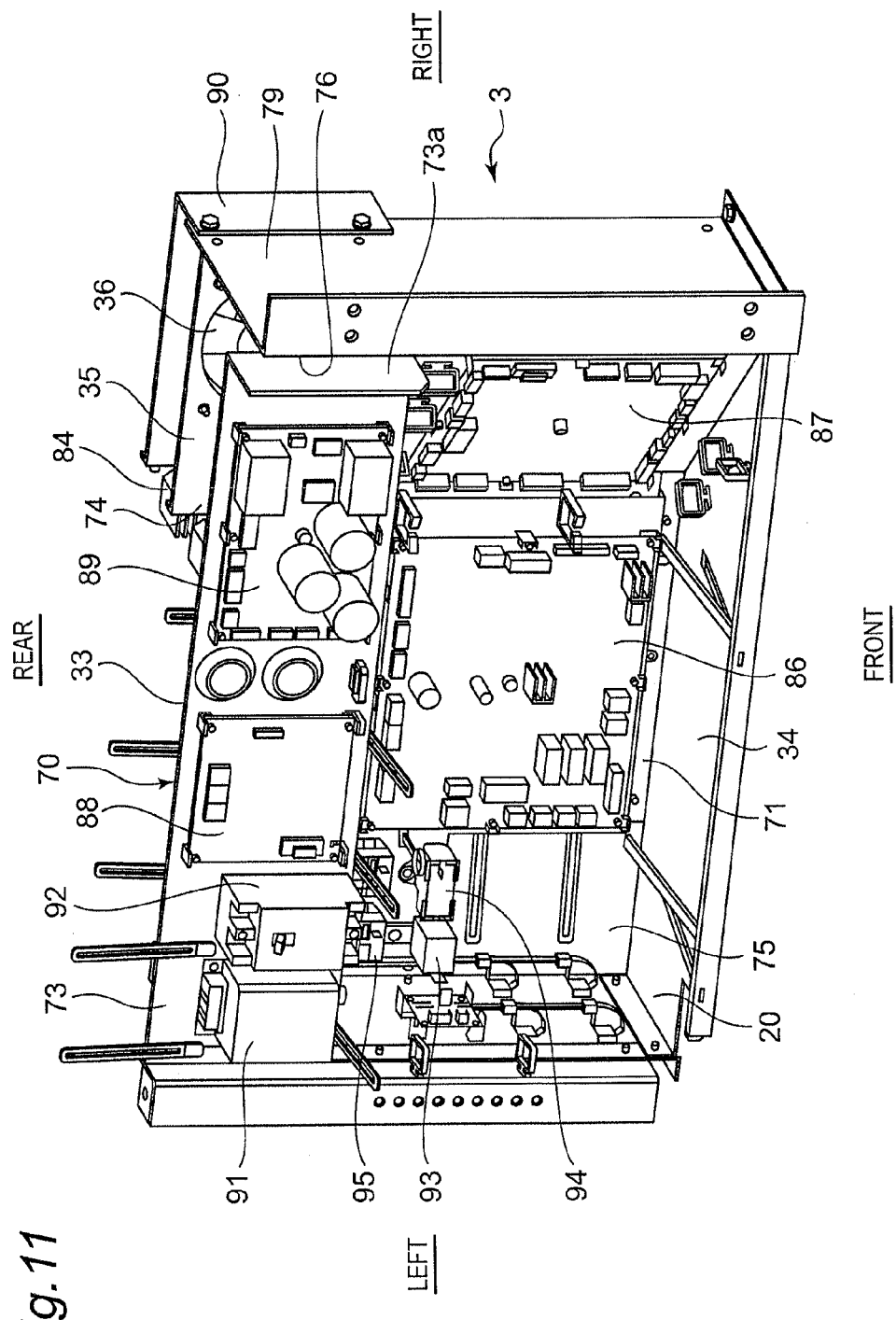
FIG. 11 is a front perspective view schematically illustrating a low heat generation chamber in the upper space of the cogeneration apparatus.

The left region of the upper space 3 is partitioned, by the first wall 70 extended in the right-left direction, into the high heat generation chamber 33 located in the rear of the upper space 3, and the low heat generation chamber 34 located in the front of the upper space 3. As illustrated in FIG. 11, the first wall 70 includes a lower vertical plate 71, a horizontal plate 72 and an upper vertical plate 73, and the upper vertical plate 73 is disposed forward of the lower vertical plate 71 so that the first wall 70 has a stepped shape.

Electrical components that generate a small amount of heat, i.e., low heat generation components, such as an ignition circuit board 86, a control circuit board 87, a relay 93, a capacitor 94 and a relay 95 are placed on a front side of the lower vertical plate 71 which is included in the low heat generation chamber 34. Similarly, electrical components that generate a small amount of heat, i.e., low heat generation components, such as a working circuit board 88, a power source circuit board 89, a noise filter 91 and a breaker 92 are placed on a front side of the upper vertical plate 73 which is included in the low heat generation chamber 34.

As described above, the components such as the operation circuit board 88 and the breaker 92 are placed on the front side of the upper vertical plate 73 located forward of the lower vertical plate 71, thus allowing an operator to operate these devices with ease.

Figure 12:
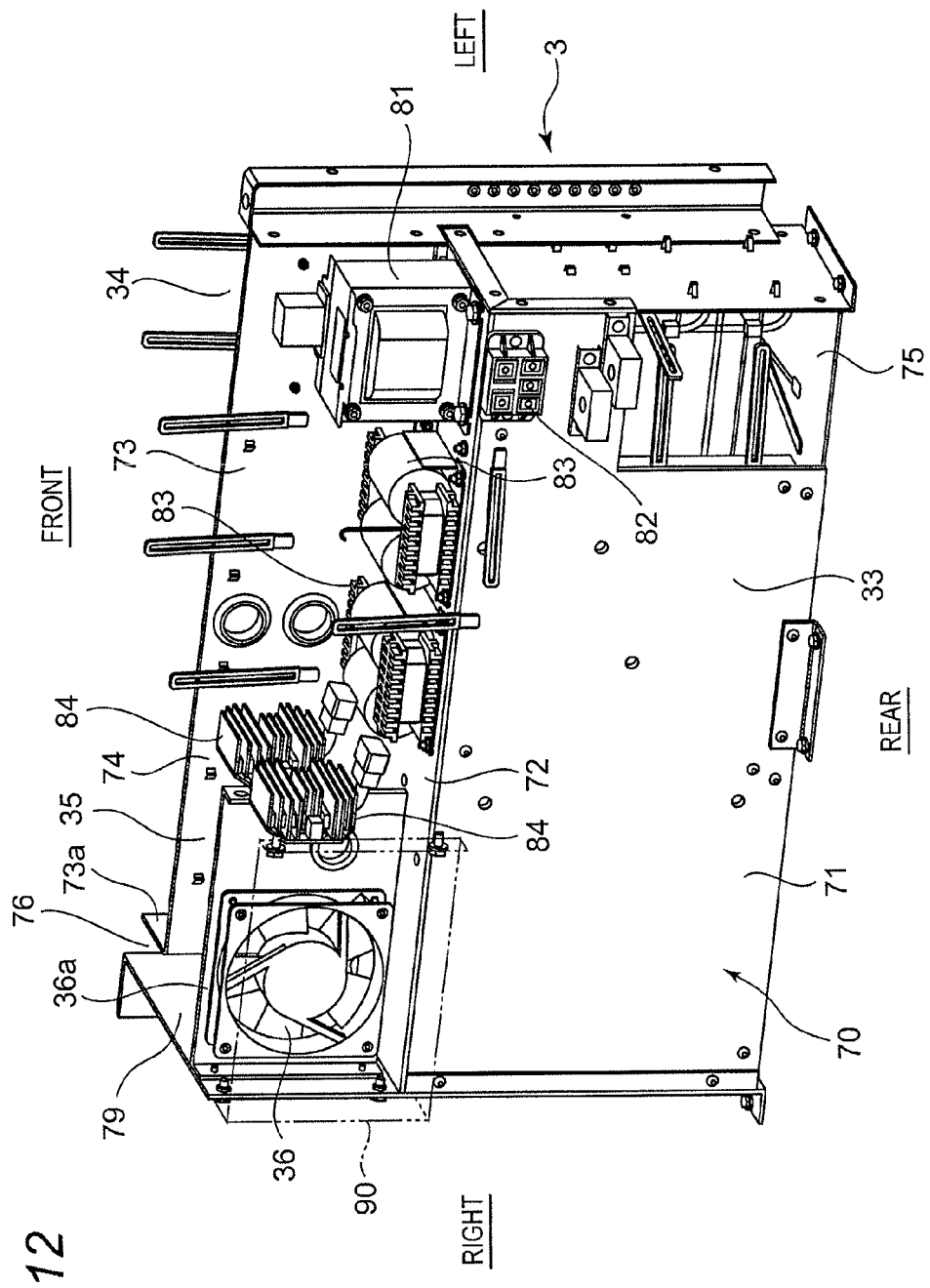
FIG. 12 is a rear perspective view schematically illustrating a high heat generation chamber in the upper space of the cogeneration apparatus.

As illustrated in FIG. 12, electrical components that generate a large amount of heat, i.e., high heat generation components, such as a DC reactor 81 and power source transformers 83 are placed on an upper surface of the horizontal plate 72 which is included in the high heat generation chamber 33. Similarly, an electrical component that generates a large amount of heat, i.e., a high heat generation component, such as a rectifier 82 is placed on a rear side of the lower vertical plate 71 which is included in the high heat generation chamber 33. Furthermore, electrical components that generate a large amount of heat, i.e., high heat generation components, such as regulators 84 are placed on a left lateral surface of the second wall 78 (illustrated in FIG. 8) which is included in the high heat generation chamber 33.

As illustrated in FIG. 10, the left region of the upper space 3 is partitioned into the high heat generation chamber 33 and the intake fan chamber 35 by the second wall 78 extended in the front-rear direction. Toward a front end 78a of the second wall 78 which is a front extremity thereof, an upper portion of the second wall 78 partially bites into the horizontal plate 72. A gap is provided between the front end 78a and the upper vertical plate 73. This gap is a first communication port 74 through which the high heat generation chamber 33 and the intake fan chamber 35 are communication with each other.

As illustrated in FIG. 12, a second communication port 75 is provided in a lower region of a left end portion of the lower vertical plate 71 of the first wall 70. The high heat generation chamber 33 and the low heat generation chamber 34 are communicated with each other through the second communication port 75.

As illustrated in FIG. 10, the upper vertical plate 73 of the first wall 70 is extended in the right-left direction, and a gap is provided between the third wall 79 and a right end 73a of the upper vertical plate 73 serving as a right extremity thereof. This gap is a third communication port 76 through which the low heat generation chamber 33 and the intake fan chamber 35 are communicated with each other.

The intake fan chamber 35 is a space defined by: the second wall 78 serving as a partition between the intake fan chamber 35 and the high heat generation chamber 33; the first wall 70 serving as a partition between the intake fan chamber 35 and the low heat generation chamber 34; the third wall 79 serving as a partition between the intake fan chamber 35 and the device storage chamber 38; and a fan support plate 36a to which an intake fan 36 is attached. The fan support plate 36a is fixed to a right surface of the second wall 78, a left surface of the third wall 79 and the upper surface of the horizontal plate 72. The intake fan 36 is attached to a rear side of the fan support plate 36a. A plate-like fan cover 90 is provided rearward of the intake fan 36 at a distance therefrom. A negative pressure produced by the intake fan 36 causes the outside air F to be sucked into the intake fan chamber 35 via high heat generation chamber cooling path Q and a low heat generation chamber cooling path R which will be described below.

The high heat generation chamber cooling path Q includes a path Q1 in the high heat generation chamber 33, a path Q2 in the first communication port 74 and a path Q3 in the intake fan chamber 35, and thus serves as a path through which the high heat generation components are cooled by the outside air F sucked by the intake fan 36.

The low heat generation chamber cooling path R includes a path R1 in the high heat generation chamber 33, a path R2 in the second communication port 75, a path R3 in the low heat generation chamber 34, a path R4 in the third communication port 76 and a path R5 in the intake fan chamber 35, and thus serves as a path through which the low heat generation components are cooled by the outside air F sucked by the intake fan 36.

Figure 9:
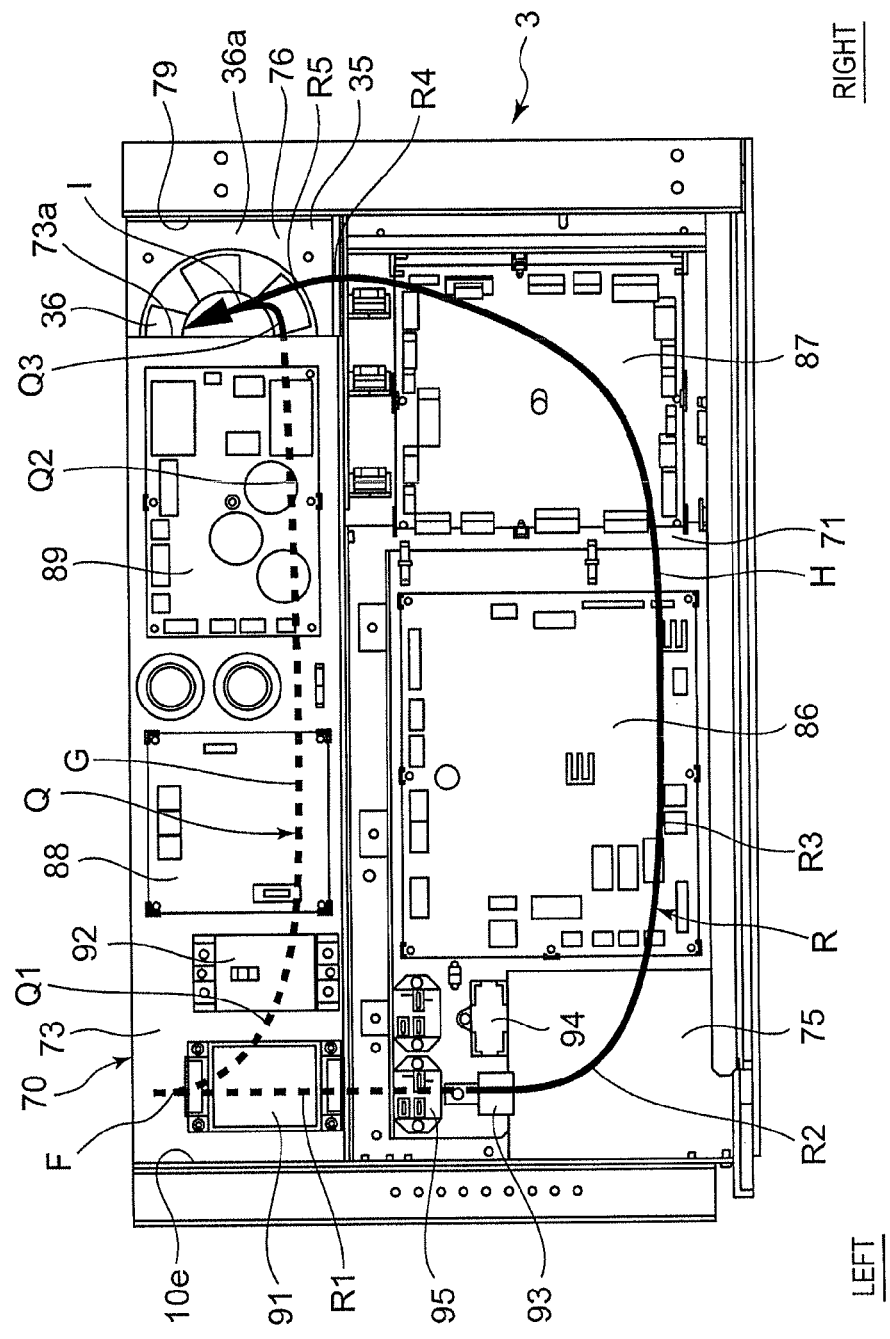
FIG. 9 is a front view schematically illustrating the upper space of the cogeneration apparatus.

Note that as illustrated in FIG. 9, the second communication port 75 (disposed in a lower left corner) through which the outside air F is introduced into the low heat generation chamber 34 and the third communication port 76 (disposed in an upper right corner) through which the outside air F is discharged from the low heat generation chamber 34 are disposed diagonally away from each other; therefore, the longer path R3 can be ensured in the low heat generation chamber 34, and thus the low heat generation components in the low heat generation chamber 34 can be cooled as uniformly as possible.

When a comparison is made between the high heat generation chamber cooling path Q and the low heat generation chamber cooling path R, a portion of the path R3 in the low heat generation chamber 34 which is close to the third communication port 76 changes in length in accordance with the location and shape of the intake fan chamber 35. However, the low heat generation chamber cooling path R makes a longer detour than the high heat generation chamber cooling path Q by at least the path R2 in the second communication port 75 and the path R4 in the third communication port 76. When the same quantity of air flows to the high heat generation chamber cooling path Q and the low heat generation chamber cooling path R, pressure loss is reduced in the shorter cooling path, and therefore, cooling air flows to the shorter cooling path in an unbalanced manner. Accordingly, the quantity of cooling air in the high heat generation chamber cooling path Q having a shorter length is larger than the quantity of cooling air in the low heat generation chamber cooling path R having a longer length, thus performing more effective cooling.

Next, how the outside air taken in from the electrical component cooling intake port 39d by a suction force of the intake fan 36 flows through the upper space 3 of the package 2 will be described.

As illustrated in FIG. 10, dust or the like contained in the outside air F taken in from the electrical component cooling intake port 39d is removed by the dust-proof filter 32. Then, the outside air F is diverted as: a high heat generation chamber cooling diverted flow G that flows along the high heat generation chamber cooling path Q; and a low heat generation chamber cooling diverted flow H that flows along the low heat generation chamber cooling path R.

The high heat generation chamber cooling diverted flow G flows through the high heat generation chamber 33 from its rear toward its front to collide against the first wall 70, and then flows along a rear surface of the high heat generation chamber 33 from the left to the right (i.e., the path R1 in the high heat generation chamber 33), thus cooling the various high heat generation components placed in the high heat generation chamber 33 (e.g., the above-mentioned components such as the DC reactor 81, the power source transformers 83, the regulators 84 and the rectifier 82). The high heat generation chamber cooling diverted flow G which has cooled the high heat generation components and increased in temperature is introduced into the intake fan chamber 35 (i.e., the path Q3 in the intake fan chamber 35) through the first communication port 74 (i.e., the path Q2 in the first communication port 74).

Meanwhile, the low heat generation chamber cooling diverted flow H flows through the high heat generation chamber 33 from its rear to its front (i.e., the path R1 in the high heat generation chamber 33), and is introduced into the low heat generation chamber 34 through the second communication port 75 of the first wall 70 (i.e., the path R2 in the second communication port 75). The low heat generation chamber cooling diverted flow H introduced through a lower left end portion of the low heat generation chamber 34 flows along a front surface of the low heat generation chamber 34 from the left to the right (i.e., the path R3 in the low heat generation chamber 34), thus cooling the various low heat generation components placed in the low heat generation chamber 34 (e.g., the above-mentioned components such as the ignition circuit board 86, the control circuit board 87, the relay 93, the capacitor 94, the relay 95, the operation circuit board 88, the power source circuit board 89, the noise filter 91 and the breaker 92). The low heat generation chamber cooling diverted flow H which has cooled the low heat generation components and increased in temperature is introduced into the intake fan chamber 35 (i.e., the path R5 in the intake fan chamber 35) through the third communication port 76 in an upper right end portion of the low heat generation chamber 34 (i.e., the path R4 in the third communication port 76).

The high heat generation chamber cooling diverted flow G and the low heat generation chamber cooling diverted flow H, which have been introduced into the intake fan chamber 35, merge into intake cooling air I. The intake cooling air I flows substantially horizontally through the intake fan chamber 35 from its front toward its rear, and then collides against the fan cover 90; thus, a flow direction of the intake cooling air I changes to a downward direction. The intake cooling air I, which flows downward, is merged with ventilation air of the lower space 4 flowing into the device storage chamber 38 from the air vent 37, and is discharged into the outside space through the ventilation exhaust port 39b of the right side upper panel 10b.

In the above-described embodiment, the outside air F sucked through the single electrical component cooling intake port 39d is diverted as the high heat generation chamber cooling diverted flow G flowing along the high heat generation chamber cooling path Q and the low heat generation chamber cooling diverted flow H flowing along the low heat generation chamber cooling path R, and these diverted flows G and H are merged in the intake fan chamber 35. Since it is only necessary to dispose the single dust-proof filter 32 for the single intake port 39d, the number of assembly steps and the number of maintenance steps for the dust-proof filter 32 can be reduced, thus achieving the effect of enabling cost reduction.

Note that layouts of various constituent elements in the above-described embodiment, i.e., locations of the first communication port 74, the second communication port 75 and the third communication port 76, forms of the first wall 70, the second wall 78 and the third wall 79, forms of the high heat generation chamber cooling path Q and the low heat generation chamber cooling path R, and types and locations of the high heat generation components and low heat generation components placed in the high heat generation chamber and low heat generation chamber, respectively, for example, are provided by way of example only, and are not limited to those described in the foregoing embodiment.

In view of the amount of heat generated by the placed electrical components and the suction force of the intake fan 36, an opening area of each of the first communication port 74, the second communication port 75 and the third communication port 76 is appropriately decided to bring the quantity of air into balance in such a manner that the temperature of each of the high heat generation components in the high heat generation chamber 33 and the low heat generation components in the low heat generation chamber 34, respectively, will not exceed a given temperature.

The foregoing embodiment has been described on the assumption that the generator 6 is used as a working machine of the packaged engine working machine 1; however, when the packaged engine working machine 1 serves as an engine heat pump, a compressor is installed instead of the generator 6. Alternatively, both of the generator 6 and compressor may be installed as working machines of the packaged engine working machine 1.

DESCRIPTION OF THE REFERENCE CHARACTERS 1 cogeneration apparatus (packaged engine working machine)
2 package (housing)
3 upper space
4 lower space
5 engine
6 generator (working machine)
32 dust-proof filter
33 high heat generation chamber
34 low heat generation chamber
35 intake fan chamber
36 intake fan
39d electrical component cooling intake port
70 first wall
74 first communication port
75 second communication port
76 third communication port
78 second wall
79 third wall
F outside air
Q high heat generation chamber cooling path
R low heat generation chamber cooling path

The invention claimed is:

1. A packaged engine working machine in which an engine and a working machine driven by the engine are disposed in a lower space of a package, and electrical components for the engine and the working machine are disposed in an upper space of the package,
wherein the upper space is partitioned into: a high heat generation chamber in which high heat generation components included in the electrical components are collectively disposed; a low heat generation chamber in which low heat generation components included in the electrical components and having amounts of heat smaller than those of the high heat generation components are collectively disposed; and an intake fan chamber provided with an intake fan for sucking outside air through a single intake port provided in a panel constituting a wall surface of the high heat generation chamber,
wherein the high heat generation chamber and the low heat generation chamber are extended in a longitudinal direction of the upper space and adjacent to each other in a width direction of the upper space, and the intake fan chamber is adjacent to the high heat generation chamber and the low heat generation chamber,
wherein a first wall serving as a partition between the high heat generation chamber and the intake fan chamber comprises a first communication port through which the high heat generation chamber and the intake fan chamber are communicated with each other,
wherein a second wall serving as a partition between the high heat generation chamber and the low heat generation chamber comprises a second communication port through which the high heat generation chamber and the low heat generation chamber are communicated with each other,
wherein a third wall serving as a partition between the low heat generation chamber and the intake fan chamber comprises a third communication port through which the low heat generation chamber and the intake fan chamber are communicated with each other, and
wherein the packaged engine working machine comprises: a high heat generation chamber cooling path through which the outside air from the intake port reaches the intake fan chamber via the high heat generation chamber and the first communication port; and a low heat generation chamber cooling path through which the outside air from the intake port reaches the intake fan chamber via the high heat generation chamber, the second communication port, the low heat generation chamber and the third communication port.

2. The packaged engine working machine according to claim 1,
wherein the high heat generation chamber cooling path is shorter than the low heat generation chamber cooling path.

3. The packaged engine working machine according to claim 1,
wherein the low heat generation chamber is disposed in a front of the packaged engine working machine.

4. The packaged engine working machine according to of claim 1,
wherein the intake port is provided at a position distant from the intake fan chamber.

5. The packaged engine working machine according to claim 1,
wherein the first communication port is provided close to the first wall.

6. The packaged engine working machine according to claim 1,
wherein the second communication port is provided at a position distant from the intake fan chamber.

7. The packaged engine working machine according to claim 1,
wherein the third communication port is provided at a position distant from the second communication port.

* * * * *